(12) United States Patent
Zhang et al.

(10) Patent No.: US 10,755,975 B2
(45) Date of Patent: Aug. 25, 2020

(54) TUNNELING ELECTRICAL CONTACTS

(71) Applicant: Board of Trustees of Michigan State University, East Lansing, MI (US)

(72) Inventors: Peng Zhang, East Lansing, MI (US); Sneha Banerjee, East Lansing, MI (US); John Luginsland, East Lansing, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 0 days.

(21) Appl. No.: 16/448,160

(22) Filed: Jun. 21, 2019

(65) Prior Publication Data

US 2019/0393087 A1 Dec. 26, 2019

Related U.S. Application Data

(60) Provisional application No. 62/688,515, filed on Jun. 22, 2018.

(51) Int. Cl.
*H01L 21/66* (2006.01)
*H01L 51/00* (2006.01)
(Continued)

(52) U.S. Cl.
CPC .. *H01L 21/76886* (2013.01); *H01L 21/67253* (2013.01); *H01L 22/12* (2013.01); *H01L 51/0048* (2013.01)

(58) Field of Classification Search
None
See application file for complete search history.

(56) References Cited

U.S. PATENT DOCUMENTS

| | | | |
|---|---|---|---|
| 2006/0237537 A1* | 10/2006 | Empedocles | H01L 29/42392 235/439 |
| 2013/0323895 A1* | 12/2013 | Sandhu | H01L 29/42332 438/257 |
| 2017/0141319 A1* | 5/2017 | Noh | H01L 51/0049 |

OTHER PUBLICATIONS

Banerjee, S., Luginsland, J., and Zhang, P. A Two Dimensional Tunneling Resistance Transmission Line Model for Nanoscale Parallel Electrical Contacts. Cornell University [online], submitted Jun. 21, 2019 [retrieved Sep. 13, 2019]. Retrieved from Internet: <URL: https://arxiv.org/abs/1906.09188>.

(Continued)

*Primary Examiner* — Asok K Sarkar
(74) *Attorney, Agent, or Firm* — Harness, Dickey & Pierce, PLC

(57) ABSTRACT

A method of constructing an electrical contact including a contact element positioned between a first contact member and a second contact member. The method includes defining a transmission line model to represent operation of the electrical contact. The transmission line model indicates a contact resistance and a specific contact resistivity along a length of the contact element. The method includes determining a current flow profile of the contact element. The current flow profile is determined based on a current distribution using the transmission line model. The method includes determining one of: (i) a material, (ii) a thickness, and (iii) a geometry of the contact element based on the contact resistance and the current flow profile of the transmission line model. The method includes constructing the contact element positioned between the first contact member and the second contact member with the at least one of (i) the material, (ii) the thickness, and (iii) the geometry.

20 Claims, 10 Drawing Sheets

(51) Int. Cl.
*H01L 21/768* (2006.01)
*H01L 21/67* (2006.01)

(56) References Cited

OTHER PUBLICATIONS

Zhang, P., Banrjee, S., and Luginsland, J. Tunneling Electrical Contacts. Michigan State University [online], published Jun. 28, 2018 [retrieved on Sep. 13, 2019]. Retrieved from the Internet: <URL: http://msut.technologypublisher.com/technology/27990>.

* cited by examiner

TUNNELING ELECTRICAL CONTACTS

CROSS-REFERENCE TO RELATED APPLICATIONS

This application claims the benefit of U.S. Provisional Application 62/688,515, filed Jun. 22, 2018. The entire disclosure of the above application is incorporated herein by reference.

GOVERNMENT CLAUSE

This invention was made with government support under FA9550-18-1-0061 awarded by the U.S. Air Force Office of Scientific Research. The government has certain rights in the invention.

FIELD

The present disclosure relates to design of contact layer properties and geometry of tunneling electrical contacts.

BACKGROUND

Nanoscale electrical contacts have attracted substantial attention due to the advancements in nanotechnology, material sciences and growing demands for miniaturization of electronic devices and high packing density. Contact resistance and their electro-thermal effects have become one of the most critical concerns of very large scale integration (VLSI) circuit designers because of the excessive amount of Joule heating being deposited at the contact region. The growing popularity of novel electronic circuits based on graphene, carbon nanotubes (CNTs), new two-dimensional (2D) materials (boron nitride, molybedenum sulfide, black phosphorus, etc.), and new nano-composites has made contact engineering crucial. To improve reliability and lifetime of a device with nanoscale contacts, control of the electrical properties in the contact area is critical, which can open doors for new device opportunities.

Tunneling type of electrical contacts have become ubiquitous for novel materials based devices, where the contacting members are separated by very thin (~1 nm or less) insulating layers. For example, tunneling effects in contact junctions dictate the electrical conductivity of the CNT/polymer composite thin films. Tunneling resistance also plays a dominant role in the electrical conductivity of CNT-based polymeric or ceramic composites.

For decades, the basic models of tunneling current between electrodes separated by thin insulating films have been those of Simmons in 1960s. Simmon's formula have since been used for evaluating tunneling current in tunneling junctions. Though there have been attempts to extend Simmons' models to the field emission and space-charge-limited regimes, existing models always assume that the tunneling junctions are one-dimensional (1D); therefore, there are no variations on the voltage drops along the length of the tunneling junction and the insulating film thickness is uniform.

Thus, these existing models of tunneling junctions provide no insight regarding the variation of tunneling current along the contact length and ignore the importance of current crowding near the contact area when the two contacting members are partially overlapping. More importantly, there is generally a lacking of a method to precisely control the current crowding effects in nanoscale electrical contacts to improve heat management and increase reliability and lifetime of electronics.

This section provides background information related to the present disclosure which is not necessarily prior art.

SUMMARY

A method of constructing an electrical contact including a contact element positioned between a first contact member and a second contact member. The method includes defining a transmission line model to represent operation of the electrical contact. The transmission line model indicates a contact resistance and a specific contact resistivity along a length of the contact element. The method includes determining a current flow profile of the contact element. The current flow profile is determined based on a current distribution using the transmission line model. The method includes determining at least one of: (i) a material, (ii) a thickness, and (iii) a geometry of the contact element based on the contact resistance and the current flow profile of the transmission line model. The method includes constructing the contact element positioned between the first contact member and the second contact member with the at least one of (i) the material, (ii) the thickness, and (iii) the geometry. The method determines the current profile, and this control over the current profile can be used to achieve goals, such as improving heat management and increasing the reliability and lifetime of electronics.

In other aspects, the method includes identifying a first material of the first contact member and determining the at least one of (i) the material, (ii) the thickness, and (iii) the geometry of the contact element based on the first material of the first contact member. In other aspects, the method includes identifying a second material of the second contact member and determining the at least one of (i) the material, (ii) the thickness, and (iii) the geometry of the contact element based on the second material of the second contact member.

In other aspects, the method includes identifying a first geometry of the first contact member and determining the at least one of (i) the material, (ii) the thickness, and (iii) the geometry of the contact element based on the first geometry of the first contact member. In other aspects, the method includes identifying a second geometry of the second contact member and determining the at least one of (i) the material, (ii) the thickness, and (iii) the geometry of the contact element based on the second geometry of the second contact member.

In other aspects, the method includes identifying a first set of dimensions of the first contact member and determining the at least one of (i) the material, (ii) the thickness, and (iii) the geometry of the contact element based on the first set of dimensions of the first contact member. In other aspects, the method includes identifying a second set of dimensions of the second contact member and determining the at least one of (i) the material, (ii) the thickness, and (iii) the geometry of the contact element based on the second set of dimensions of the second contact member.

In other aspects, the current flow profile is determined based on a voltage distribution using the transmission line model. In other aspects, the specific contact resistivity along the length of the contact element varies. In other aspects, the electrical contact is defined as ohmic when the specific contact resistivity varies based on nonuniform doping and/or varying thickness of the conducting contact element. In other aspects, the electrical contact is defined as tunneling when the specific contact resistivity varies based on a varying permittivity and/or a varying thickness of the insulating contact element. In other aspects, the current flow profile is determined based on an input voltage applied to the electrical contact.

A method of constructing an electrical contact including a contact element positioned between a first contact member and a second contact member. The method includes defining a transmission line model to represent operation of the electrical contact. The transmission line model indicates a contact resistance and a specific contact resistivity along a length of the contact element. The specific contact resistivity along the length of the contact element varies. The method includes determining a current flow profile of the contact element. The current flow profile is determined based on a current distribution and a voltage distribution using the transmission line model. The method includes determining (i) a material, (ii) a thickness, and (iii) a geometry of the contact element based on the contact resistance and the current flow profile of the transmission line model. The method includes constructing the contact element positioned between the first contact member and the second contact member with (i) the material, (ii) the thickness, and (iii) the geometry.

In other aspects, the method includes, for the first contact member and the second contact member, identifying a material comprising the first contact member and the second contact member and determining (i) the material, (ii) the thickness, and (iii) the geometry of the contact element based on the material. In other aspects, the method includes identifying a geometry and dimensions of the first contact member and the second contact member and determining (i) the material, (ii) the thickness, and (iii) the geometry of the contact element based on the geometry and dimensions of the first contact member and the second contact member.

In other aspects, the electrical contact is defined as tunneling when the specific contact resistivity varies based on a varying permittivity and/or varying thickness of the insulating contact element. In other aspects, the current flow profile is determined based on an input voltage applied to the electrical contact.

A method of constructing an electrical contact including a contact element positioned between a first contact member and a second contact member. The method includes defining a transmission line model to represent operation of the electrical contact. The transmission line model indicates a contact resistance and a specific contact resistivity along a length of the contact element. The specific contact resistivity along the length of the contact element varies. The method includes determining a current flow profile of the contact element. The current flow profile is determined based on a current distribution and a voltage distribution using the transmission line model. The method includes, for the first contact member and the second contact member, identifying contact member data including (i) a material, (ii) a geometry, and (iii) a set of dimensions. The method includes determining (i) a material, (ii) a thickness, and (iii) a geometry of the contact element based on the contact resistance and the current flow profile of the transmission line model as well as the contact member data of the first contact member and the second contact member. The method includes constructing the contact element positioned between the first contact member and the second contact member with (i) the material, (ii) the thickness, and (iii) the geometry.

In other aspects, the electrical contact is defined as tunneling when the specific contact resistivity varies based on a varying permittivity and/or varying thickness of the insulating contact element.

In other aspects, the current flow profile is determined based on an input voltage applied to the electrical contact.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1A:
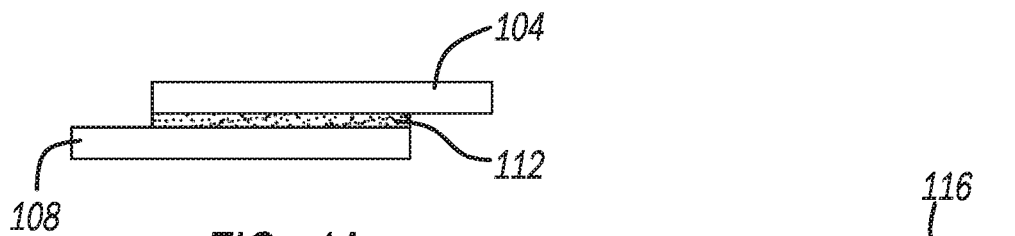
FIGS. 1A-1H depict example electrical contacts between a first contact member and a second contact member with a contact element or a thin interfacial layer (ohmic or tunneling type) of varying specific contact resistivity along a contact length.

Example embodiments will now be described more fully with reference to the accompanying drawings.

Implementing a transmission line model (TLM) to construct a contact element positioned between two electrical contact members provides effective control over current distribution and contact resistance in nanoscale electrical contacts via engineered spatially varying contact element or layer properties and geometry. Constructing electrical contacts, ohmic or tunneling, based on particular current distribution needs or contact resistance needs provides a solution to localized overheating and allows the electrical contacts in nanoscale electronics to operate as needed. The TLM model may be used to solve for design parameters of contact members as well as the contact element positioned between the contact members. The magnitude and location of the maximum/minimum contact current density and, therefore, the local heating effects, can be manipulated by varying the specific contact resistivity of the contact element along the contact length.

Contact resistance and current crowding are important to nanoscale electrical contacts, such as those based on metal-insulator-metal (MIM) thin junctions, carbon nanotube (CNT) networks, and other two-dimensional (2D) materials. Electron tunneling effects and contact resistance across such contacts greatly influence the device properties and performance within, for example, a circuit. Current crowding effects in these contacts can lead to localized overheating and the formation of thermal hot spots, thus influencing the device's thermal handling capability, reliability, and lifetime. Hence, to improve reliability and lifetime of the device, it is critical to control the electrical properties in these contact structures.

Therefore, in the presently disclosed tunneling electrical contacts, contact resistance and current flow profile are controlled via engineered spatially varying contact layer properties and geometry. Using a self-consistent model based on lumped circuit TLM, current crowding effects such as localized overheating and formation of thermal hot spots can be eliminated. The TLMs for electrical contacts typically assume the contact resistivity of the interface layers are constant. It is questionable to apply these models to study the tunneling contacts, as the tunneling resistance depends on the junction voltage that varies spatially along the contact length.

The presently disclosed tunneling electrical contacts include the spatial variation of specific contact resistivity, which can be achieved via nonuniform doping for ohmic or Schottky contact or engineered varying interfacial layer thickness and/or permittivity for tunneling electrical contacts. In this way, ohmic or tunneling contacts may be precisely customized using a profile of the current transport along the contact length of an electrical contact (modeling after a TLM) to maximize the control over device operation and heat distribution. The TLM is capable of predicting a total contact resistance and a current distribution for different contact geometries (as shown in FIGS. 1A-1H) over a wide range of input parameters. Additionally, using the TLM model, a sensitivity may be estimated of the local specific contact resistivity to the interfacial layer properties and geometry to improve the design of nano-scale semiconductor devices and integrated circuits.

Referring now to FIGS. 1A-1H, examples of electrical contacts between a first contact member and a second contact member with a contact element or a thin interfacial layer (ohmic or tunneling type) of varying specific contact resistivity along the contact length is shown. The varying specific contact resistivity along the contact length of the contact element 112 can be achieved via nonuniform doping and/or layer thickness for ohmic or Schottky contacts, or engineered varying interfacial layer thickness and/or permittivity for tunneling electrical contacts. FIG. 1A depicts a first contact member 104 and a second contact member 108 with a contact element 112 positioned between the two members. In FIG. 1A, using the TLM, the varying specific contact resistivity along the contact length may be achieved using nonuniform doping of the contact element 112.

Figure 1B:
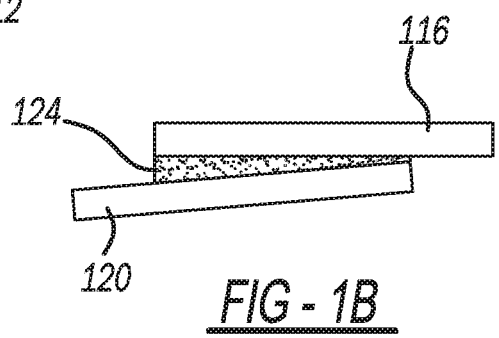
Figure 1C:
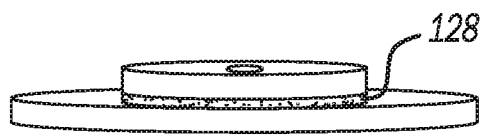
Figure 1D:
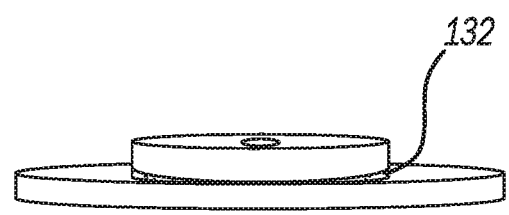
Figure 1E:
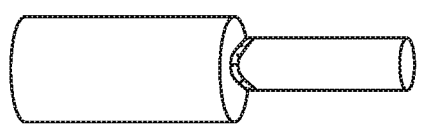
Figure 1F:
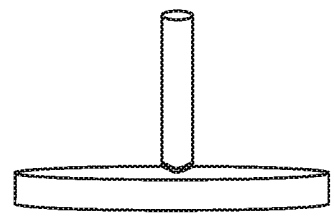
Figure 1G:
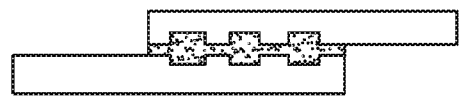
Figure 1H:
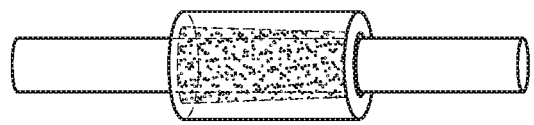

FIG. 1B also depicts a first contact member 116 and a second contact member 120 surrounding a contact element 124 with varying thickness for varying the specific contact resistivity along the contact length of the contact element 124. Similarly, FIGS. 1C and 1D depict the two types, FIG. 1C showing uniform thickness of a contact element 128 and FIG. 1D showing a varying thickness of a contact member 132. However, FIGS. 1C and 1D also depict contact members of different geometries. FIGS. 1C and 1D depict disc contact members with a hole in the middle. FIGS. 1E-1H also depict varying contact elements between two contact members. The contact members of FIGS. 1E-1H vary in geometry and dimensions and contact area.

To design nanoscale electrical contacts with controlled current and voltage distribution via engineered spatially varying contact layer properties and geometry, a lumped circuit TLM is used to get a self-consistent analysis of contact resistivity, current distribution, and voltage distribution across contact elements with varying specific contact resistivity ($\rho_c$) along the contact length. The spatial variation of $\rho_c$ can be achieved via nonuniform doping and/or layer thickness for ohmic or Schottky contacts, or engineered varying interfacial layer thickness and/or permittivity for tunneling electrical contacts. The non-homogeneity of the current and voltage distribution in tunneling type contacts can be effectively reduced by varying the specific contact resistivity ($\rho_c$) along the contact length of the contact element, such as contact element 112 of FIG. 1A and contact element 124 of FIG. 1B.

As described above, various contact geometries between two contacting members, with a thin interfacial layer (ohmic or tunneling type) of varying thickness along the contact length are shown in FIGS. 1A-1H. For tunneling type of electrical contacts, the current and voltage distribution along the nanoscale electrical contacts (contact elements) and their overall contact resistance greatly depend on input voltage, electrical contact dimension, and material properties (that is, work function, sheet resistance of the contact members, and permittivity of the insulating layer). The proposed self-consistent model is implemented to determine these factors and direct how to construct the contact element as well as the contact members.

Figure 2A:
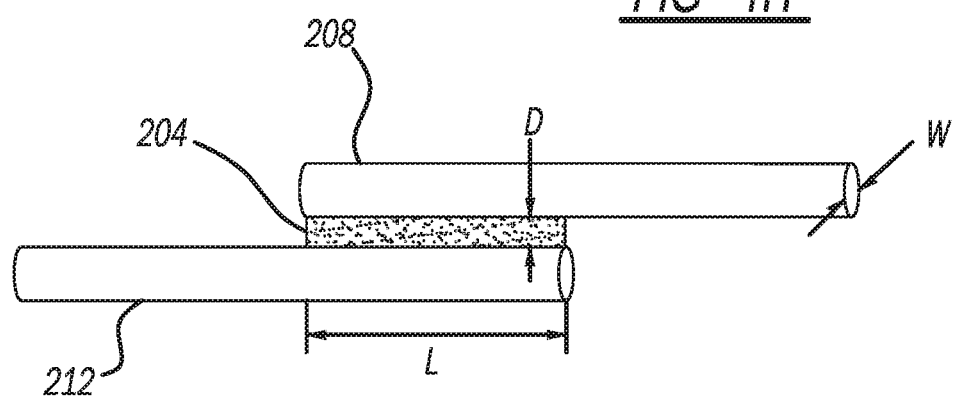
FIGS. 2A-2C depict a nanotube (or nanowire) and thin film, parallel, partially overlapped electric contacts.
Figure 2B:
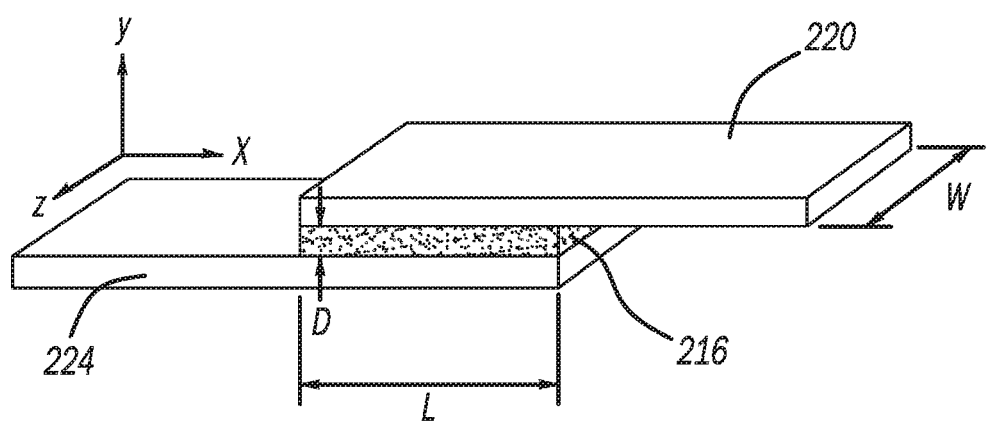
Figure 2C:
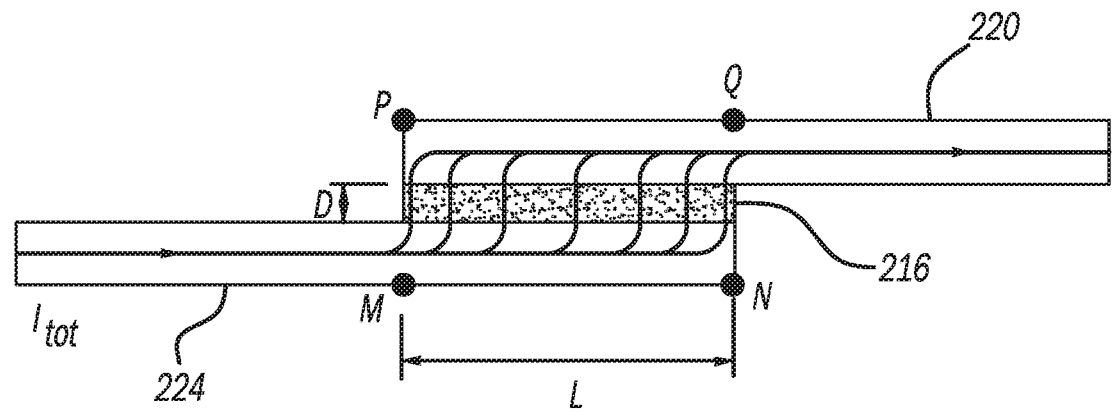

In FIGS. 2A-2C, a parallel, partially overlapped electric contact is depicted. In FIG. 2A, a contact element 204 is formed between a first nanotube 208 (or nanowire) and a second nanotube 212 (or nanowire). The contact element 204 has contact length L and distance between contact members D. The first nanotube 208 and second nanotube 212 have a width W. In FIG. 2B, a contact element 216 has contact length L and distance between contact members D. The contact element 216 is positioned between a first thin film 220 and a second thin film 224. The first thin film 220 and the second thin film 224 have width W. FIG. 2C depicts a side view of the contact of FIGS. 2A and 2B.

Figure 3:
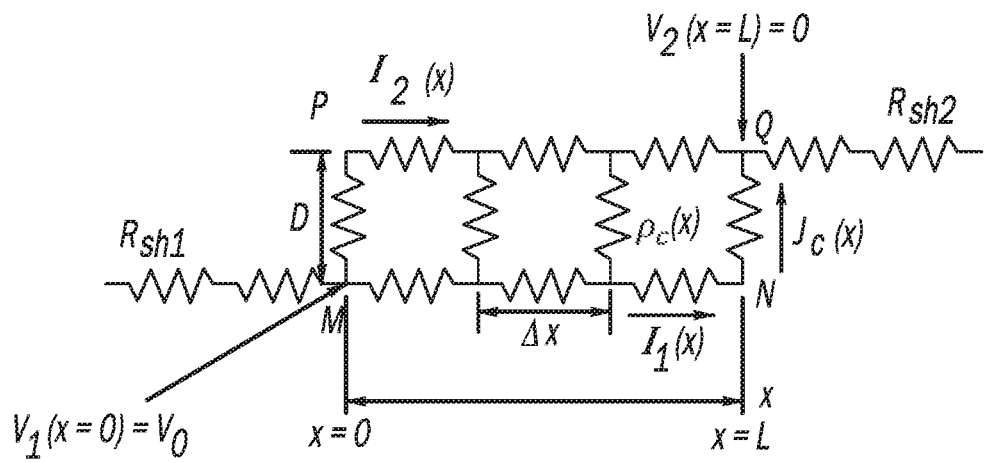
FIG. 3 depicts a transmission line model (TLM) used to determine characteristics of the contact element and contact members of FIG. 2C.

FIG. 3 depicts a TLM analyzed to determine characteristics of the contact element and contact members of FIG. 2C. In FIGS. 2A-2C, the contact elements are a thin resistive interface layer (or a tunneling layer of permittivity $\varepsilon_r$) that is sandwiched between the two contacting members. Consider a parallel contact formed between two nanowires or nanotubes or between two conducting thin films or layers, as shown in FIGS. 2A and 2B, respectively. The distance between the two contact members is D, and the contact length is L. The contact element or thin resistive interface layer is sandwiched between them. Both contacts in FIGS. 2A and 2B can be described by a two-dimensional (2D) model, as shown in FIG. 2C and as a TLM in FIG. 3.

In the 2D model of FIG. 3, the effects of the transverse dimension (perpendicular to the paper) can be included in the effective sheet resistances $R_{sh1}$ and $R_{sh2}$ for conductor 1 (for example, the second thin film 224 on the lower side of the contact element 216) and conductor 2 (for example, the first thin film 220 on the upper side of the contact element 216), respectively, such that there is no variation along the width w of the contact members in the transverse dimension. The spatial dependent specific interfacial resistivity (also termed specific contact resistivity) is $\rho_c(x)$, which is either predefined or calculated from the local tunneling current in case of insulating tunneling layer. That is, the DC equivalent lump circuit TLM of FIG. 3 models the 2D parallel contact in FIG. 2C.

In the contact region PQNM in FIGS. 2C and 3, using Kirchoff's laws for current and voltage, the following is shown:

$$\frac{\partial I_1(x)}{\partial x} = -w J_c(x), \quad \text{(Eq. 1a)}$$

$$\frac{\partial V_1(x)}{\partial x} = -\frac{I_1(x) R_{sh1}}{w}, \quad \text{(Eq. 1b)}$$

$$\frac{\partial I_2(x)}{\partial x} = -w J_c(x), \quad \text{(Eq. 1c)}$$

$$\frac{\partial V_2(x)}{\partial x} = -\frac{I_2(x) R_{sh2}}{w}, \quad \text{(Eq. 1d)}$$

where $I_1(x)$ and $I_2(x)$ represent the current flowing at x through the lower contact member (the second thin film 224), MN and upper contact member (the first thin film 220), PQ, respectively, and $V_1(x)$ and $V_2(x)$ the local voltage at x along MN and PQ, respectively, and w is the effective transverse dimension of the contacts, $J_c(x) = V_g(x)/\rho_c(x)$ and $V_g(x) = V_1(x) - V_2(x)$ are the local current density and the local voltage drop across the contact interface at x, respectively.

Note that, from Equations 1a and 1c, $I_1(x) + I_2(x) = I_{tot}$ = constant, where $I_{tot}$ is the total current in the circuit, to be determined from the boundary conditions. The boundary conditions for Equations 1a-1d are, $$V_1(x=0) = V_o, \quad \text{(Eq. 2a)}$$

$$I_2(x=0) = 0, \quad \text{(Eq. 2b)}$$

$$I_1(x=L) = 0, \quad \text{(Eq. 2c)}$$

$$V_2(x=L) = 0, \quad \text{(Eq. 2d)}$$

where, without loss of generality, the voltage of the upper contact member at x=L is assumed to be 0, and the externally applied voltage at x=0 of the lower contact member is assumed to be $V_0$. Note that $I_1(x=0) = I_{tot}$, and $I_2(x=0) = 0$. From Equations 1a-2d, $V_1'(x=0) = I_{tot} R_{sh1}/w$, $V_1'(x=L) = 0$, $V_2'(x=0) = 0$, and $V_2'(x=L) = -I_{tot} R_{sh2}/w$, where a prime denotes a derivative with respect to x. For the contact model in FIG. 3, the contact resistance is defined as, $$R_c = \frac{V_1(0) - V_2(L)}{I_{tot}} = \frac{V_o}{I_{tot}}. \quad \text{(Eq. 3)}$$

Equations 1a-2d are solved numerically to give the voltage and current distribution along and across the contact element or interface as well as the total contact resistance for a given electrical contact (FIGS. 2A-2C) with spatially dependent interface specific contact resistivity $\rho_c(x)$. Current and voltage distributions across a contact junction can be controlled by engineering this $\rho_c(x)$ along the contact length, which depends on the input voltage, electrical contact geometry and dimension, and material properties (that is, work function, sheet resistance of the contact members, and permittivity of the insulating layer). The model can be easily extended to cylindrical contacts (FIGS. 4A and 4B) and other geometries, examples of which are shown in FIGS. 1C-1F.

As the current and voltage distributions can be controlled by engineering the specific contact resistivity, the electrical contact geometry and dimensions as well as material properties of the electrical contact can be determined based on the input voltage. That is, the geometry and properties of a contact element of electrical contacts can be adjusted to achieve certain current and voltage distributions. Using the above calculations, the contact element and contact member shapes and properties can be adjusted to avoid localized overheating as a result of high current in a particular area.

Figure 4A:
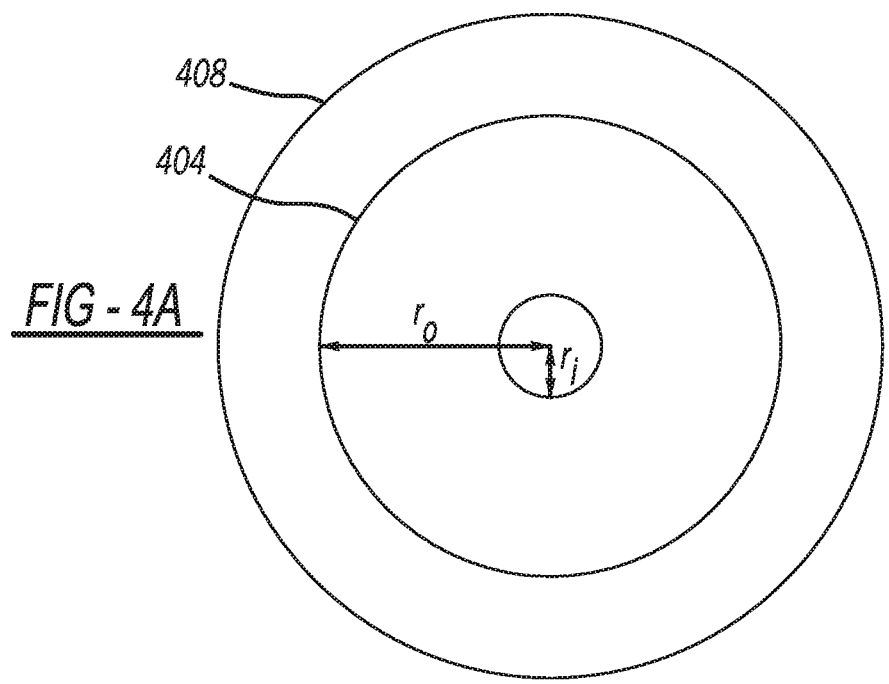
FIGS. 4A-4B depict a top view and a side view of a circular thin film electrical contact.
Figure 4B:
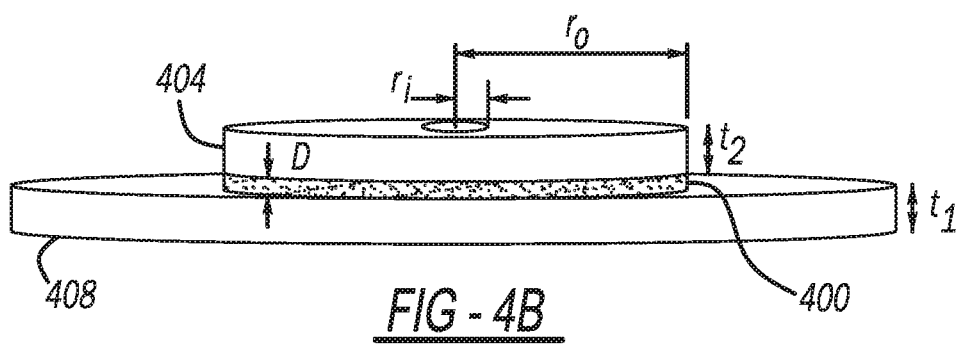

Referring to FIGS. 4A-4B, an electric contact or contact element 400 is positioned between two circular thin films 404 and 408 with inner radius $r_i$. FIG. 4A depicts a top view of the thin films 404 and 408, where a top thin film 404 has an outer radius $r_0$. FIG. 4B depicts a side view of the contact element 400 having a distance D between the top thin film 404 and the bottom thin film 408, where thin films 404 and 408 have a thickness $t_2$ and $t_1$ respectively.

Figure 5:
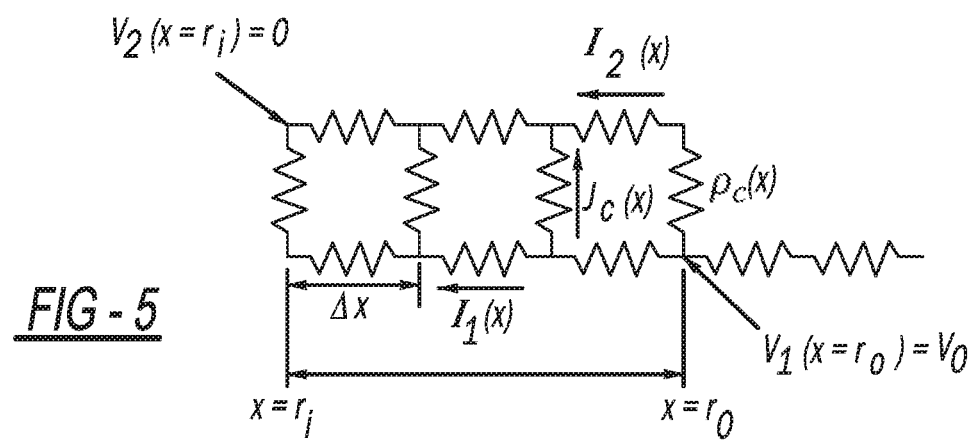
FIG. 5 depicts a TLM of the electrical contacts shown in FIGS. 4A and 4B.

FIG. 5 depicts a TLM of the electrical contacts shown in FIGS. 4A and 4B. In FIGS. 4A and 4B, the contact element is a thin resistive interface layer (or a tunneling layer of permittivity $\varepsilon_r$) that is sandwiched between the two contacting members, thin films 404 and 408. The electrical contact construction method discussed in the present disclosure is generally applicable for arbitrary spatial dependence of the specific contact resistivity $\rho_c(x)$; however, a few special cases exist.

Figure 6A:
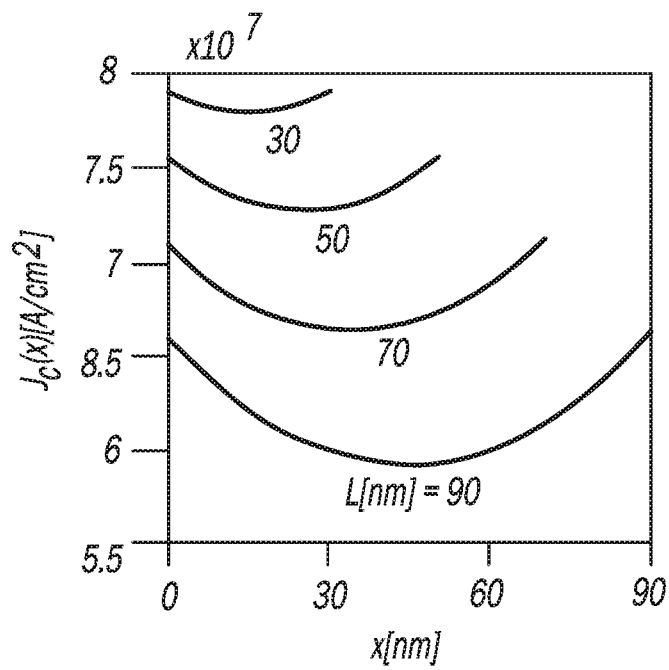
FIGS. 6A-6B are graphical depictions of contact current density profiles across a CNT-vacuum-CNT tunneling type contact interface for different contact lengths, and total contact resistance for different contact layer thickness.
Figure 6B:
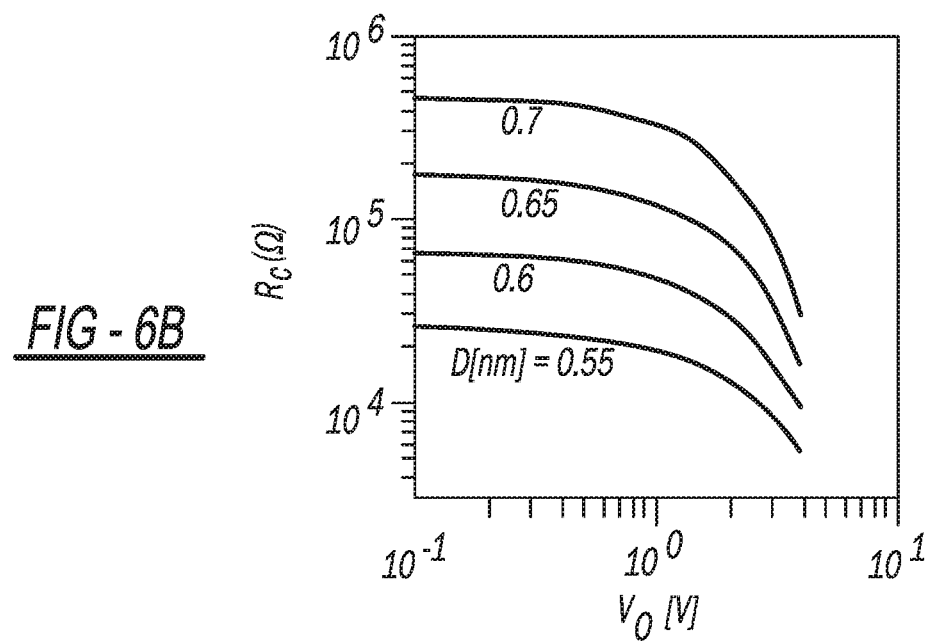

In an example implementation, FIGS. 6A and 6B are graphical depictions of the operation of parallel, partially overlapped tunneling type contacts between two CNTs. For tunneling type contacts, the local contact current densities can be calculated from the one dimensional tunneling current density formulas, using the local contact voltage drop as inputs. Referring to FIG. 6A, a tunneling current density $J_c(x)$ across the CNT-vacuum-CNT contact interface for different contact lengths L, with fixed input voltage $V_0 = 1V$, and gap distance D=0.5 nm is shown.

FIG. 6B depicts the total contact resistance $R_c$ as a function of $V_0$ for different distances D with fixed contact length L=50 nm. The graphs of FIGS. 6A-6B show the contact current density profiles across the CNT-vacuum-CNT tunneling type contact interface for different contact lengths L and total contact resistance for different gap distances D. Both the contacting members have a sheet resistance 60Ω/□ and work function 4.5 eV. The width of the contacts is assumed to be 3 nm. The profiles of $J_c(x)$ are symmetric about the center of the contact, as expected for similar contact members.

As the contact length L increases, the tunneling current density $J_c(x)$ decreases, as shown in FIG. 6A. However, the total current in the contact structure, $I_{tot} = \int_0^L J_c(x) dx$ increases with L and the total contact resistance of the tunneling junction decreases as the contact length increases. The total contact resistance $R_c$ of the CNT-vacuum-CNT parallel contact is shown in FIG. 6B, as a function of applied voltage $V_0$ for various gap distance D. For the low applied voltage regime ($V_0 < 0.3$ V), $R_c$ is almost independent of $V_0$. When the applied voltage $V_0 > 0.3$ V, $R_c$ decreases sharply with $V_0$. This is because the junction is no longer ohmic and the tunneling resistivity $\rho_c$ decreases nonlinearly with the junction voltage, which is a function of position along the contact length.

Figure 7:
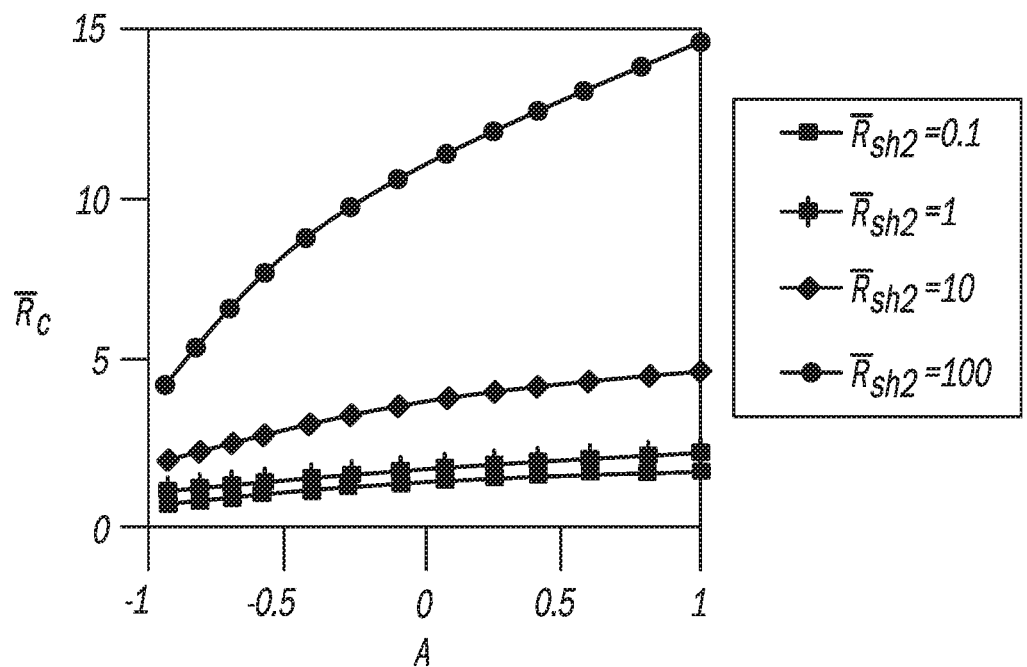
FIG. 7 is a graphical depiction of the effects of linearly varying specific contact resistivity on a contact resistance of an ohmic electrical contact.

In another example implementation, FIG. 7 is a graphical depiction of the effects of linearly varying specific contact resistivity $\rho_c(x)$ on the contact resistance of an ohmic electrical contact. FIG. 7 depicts a normalized contact resistance $\overline{R_c}=R_c/(R_{sh1}L/w)$ of the parallel contact in FIGS. 2A-2C with linear specific contact resistivity $\rho_c(x)=R_{sh1}L^2(1+Ax/L)$, for various value of $\overline{R}_{sh2}=R_{sh2}/R_{sh1}$.

The normalized contact resistance, $\overline{R_c}=R_c/(R_{sh1}L/w)$, is calculated from Equation 3 for linearly varying specific contact resistivity $\rho_c(x)=R_{sh1}L^2(1+Ax/L)$ along the contact length of FIGS. 2A-2C. As shown in FIG. 7, as A increases, $\overline{R_c}$ increases, since the contact interface becomes more resistive. As $\overline{R}_{sh2}$ increases, the contact resistance $\overline{R_c}$ depends more strongly on the linear constant A.

Figure 8:
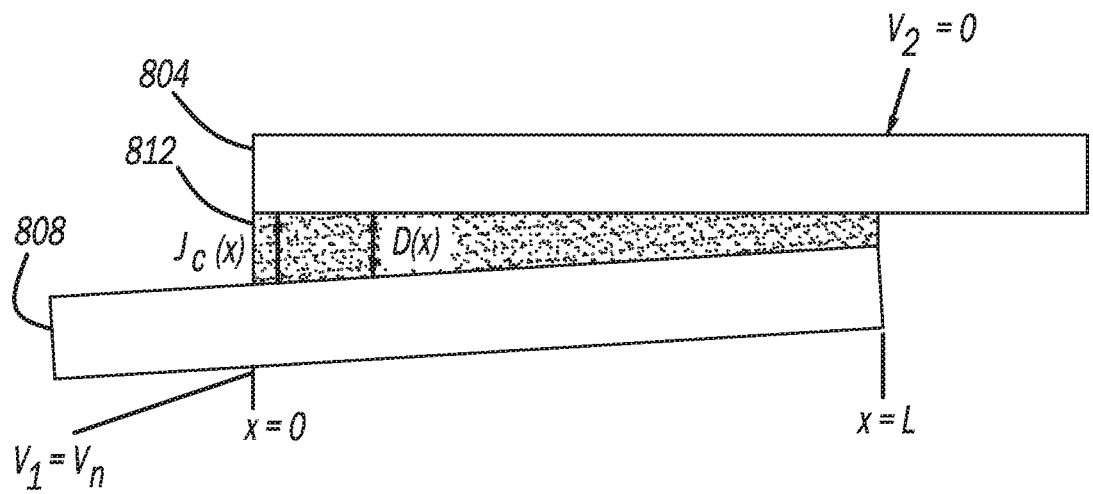
FIG. 8 is an example electrical contact including a parallel tunneling contact between two thin films with linearly varying gap distance.
Figure 9:
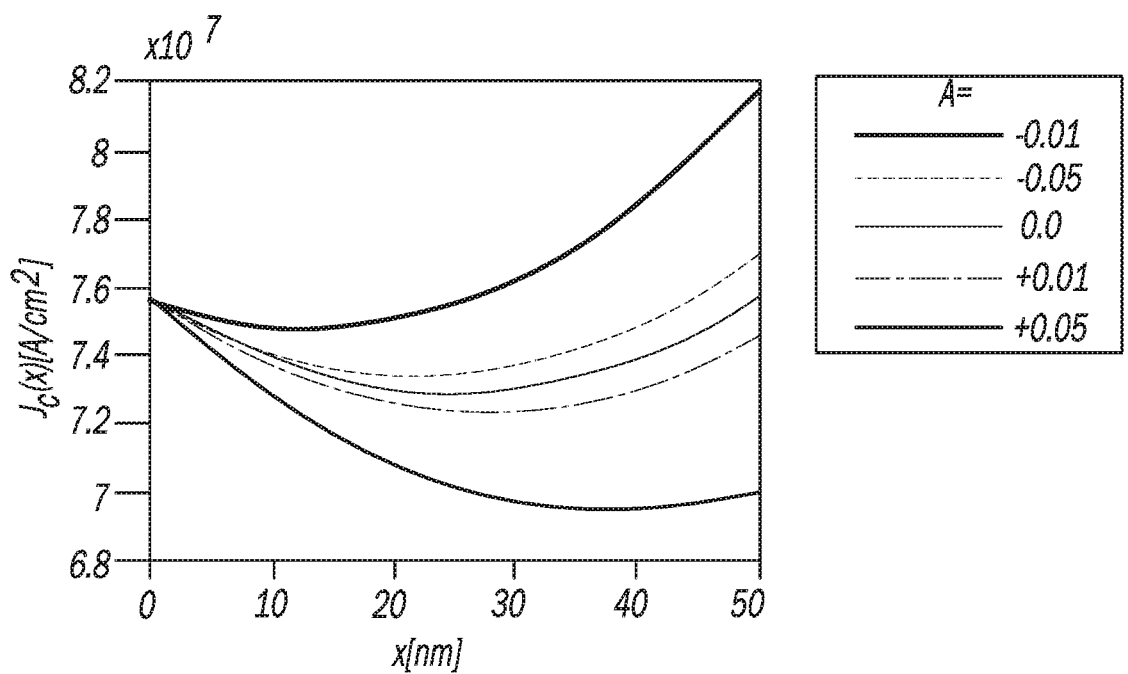
FIG. 9 is a graphical depiction of contact tunneling current density across a contact interface along the contact length of the electrical contact depicted in FIG. 8.
Figure 10:
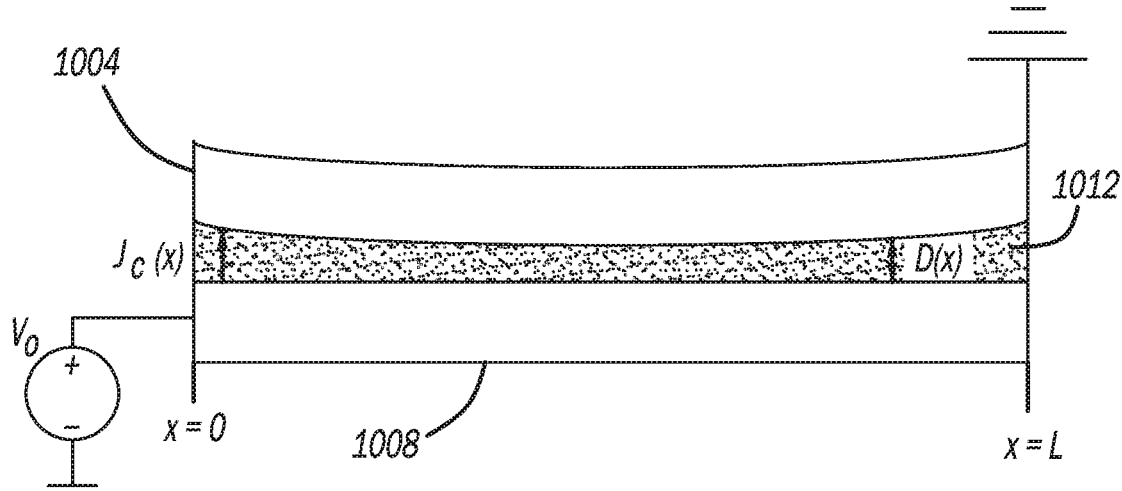
FIG. 10 is an example electrical contact including a parallel tunneling contact between two thin films with parabolically varying gap distance.

In additional example implementations, the thickness of the thin tunneling insulator layer is varied along the contact length in order to have a controlled current distribution in the contact area, as shown in FIGS. 8-11. For nanoscale electrical contacts between two thin films or nanotubes with an insulating tunneling layer or contact element, $\rho_c$ is a function of insulating layer thickness D. Contacts between two thin films separated by linearly and parabolically varying insulating layers (or gap distance) are shown in FIG. 8 and FIG. 10, respectively. That is, FIG. 8 is an example electrical contact including a parallel tunneling contact between two thin films 804 and 808 with linearly varying gap distance D. A thin insulator layer 812 or contact element is sandwiched between them.

FIG. 9 is a graphical depiction of contact tunneling current density across the contact interface $J_c(x)$ as a function of x (along the contact length) of the electrical contact depicted in FIG. 8. Here, $D(x)=(Ax+5)$ Å, where A is a linear constant, input voltage=1V and the interfacial layer is assumed to be vacuum (permittivity=1 and electron affinity=0 eV).

For a uniform gap distance D(x) (for example, FIG. 9 when A=0), the contact tunneling current density profile is symmetric, maximum occurs at the edges and minimum occurs at the center. However, when D(x) is varied linearly along the contact length, the tunneling current density profiles are highly asymmetric and the asymmetry increases with the magnitude of constant A. For an increasing D(x), the maximum occurs at x=0 and for a decreasing D(x), the maximum occurs at x=L.

Figure 11:
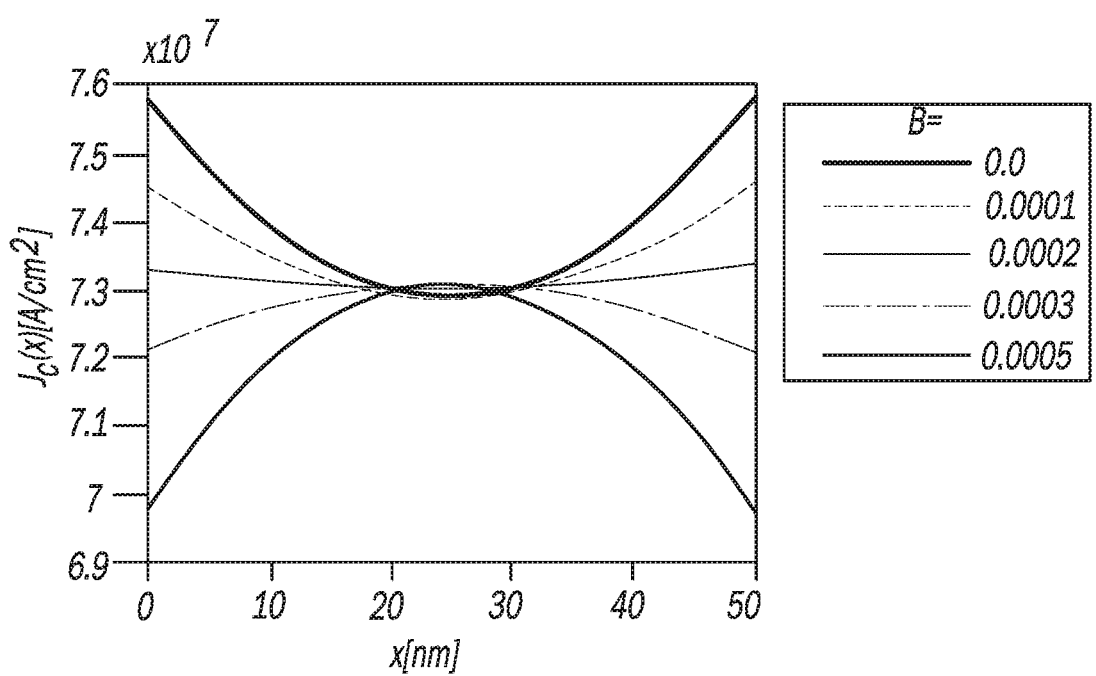
FIG. 11 is a graphical depiction of contact current density across a contact interface along the contact length of the electrical contact depicted in FIG. 10.

Referring to FIG. 10, an example electrical contact including a parallel tunneling contact between two thin films 1004 and 1008 with parabolically varying gap distance is shown. A thin insulator layer 1012 or contact element is sandwiched between the two thin films 1004 and 1008. FIG. 11 is a graphical depiction of contact current density across the contact interface $J_c(x)$ as a function of x (along the contact length) of the electrical contact depicted in FIG. 10. Here, $D(x)=B(x-L/2)^2+5$ Å, where B is a constant, input voltage=1V and the interfacial layer is assumed to be vacuum (permittivity=1 and electron affinity=0 eV).

The tunneling current density profiles across the contact area are not uniform when the gap distance D(x) between the two contacting members is uniform (for example, see FIG. 9 when A=0 and FIG. 11 when B=0). If D(x) is made to vary as a parabolic function of x in FIG. 10, the nonuniformity of the current distribution can be reduced (for example, see FIG. 11 when B=0.0002).

The TLM equations, Equations 1a-2d, coupled with Simmons' tunneling current density formula are solved self consistently, for similar contacting thin films, with sheet resistance 60Ω/□ and work function 4.5 eV. The width (w in FIGS. 2A and 2B) of the thin films of FIGS. 8 and 10 is assumed to be 3 nm.

Figure 12:
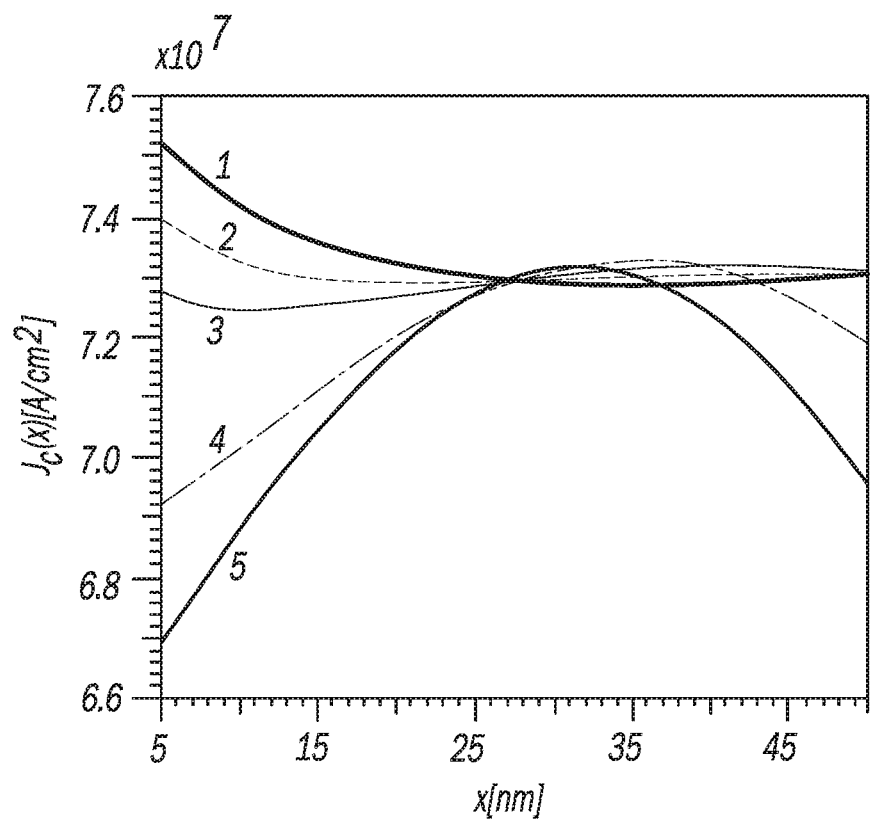
FIG. 12 is a graphical representation of contact current distribution along a radial length of a circular contact formed between two Cu thin films with a vacuum gap between them.

In another graphical depiction of electrical contact operation, the contact current distribution along the radial length of a circular contact formed between two Cu thin films is shown in FIG. 12. That is, a contact tunneling current density across the contact interface $J_c(x)$ as a function of x (along the radial contact length) of a circular tunneling-type contact structure (for example, FIGS. 4A-4B) formed between two Cu thin films for different insulator layer profiles with work function W=4.56 eV and sheet resistance $R_{sh1}=R_{sh2}=18Ω/□$ is shown. Here, D $(x)=ax^2+bx+c$ Å, where a, b, c are constants, input voltage=1V, and the interfacial layer is assumed to be vacuum (permittivity=1 and electron affinity=0 eV).

Unlike planar contacts (for example, as shown in FIG. 8 when A=0 and FIG. 11 when B=0), the tunneling current density profiles across a circular contact structure, are not symmetric when the gap distance D(x) between the two contacting members is uniform (c.f. FIG. 12, a=b=0). If D(x) is made to vary as a quadratic function of x, the nonuniformity of the current distribution can be also reduced as shown in FIG. 12.

Figure 13:
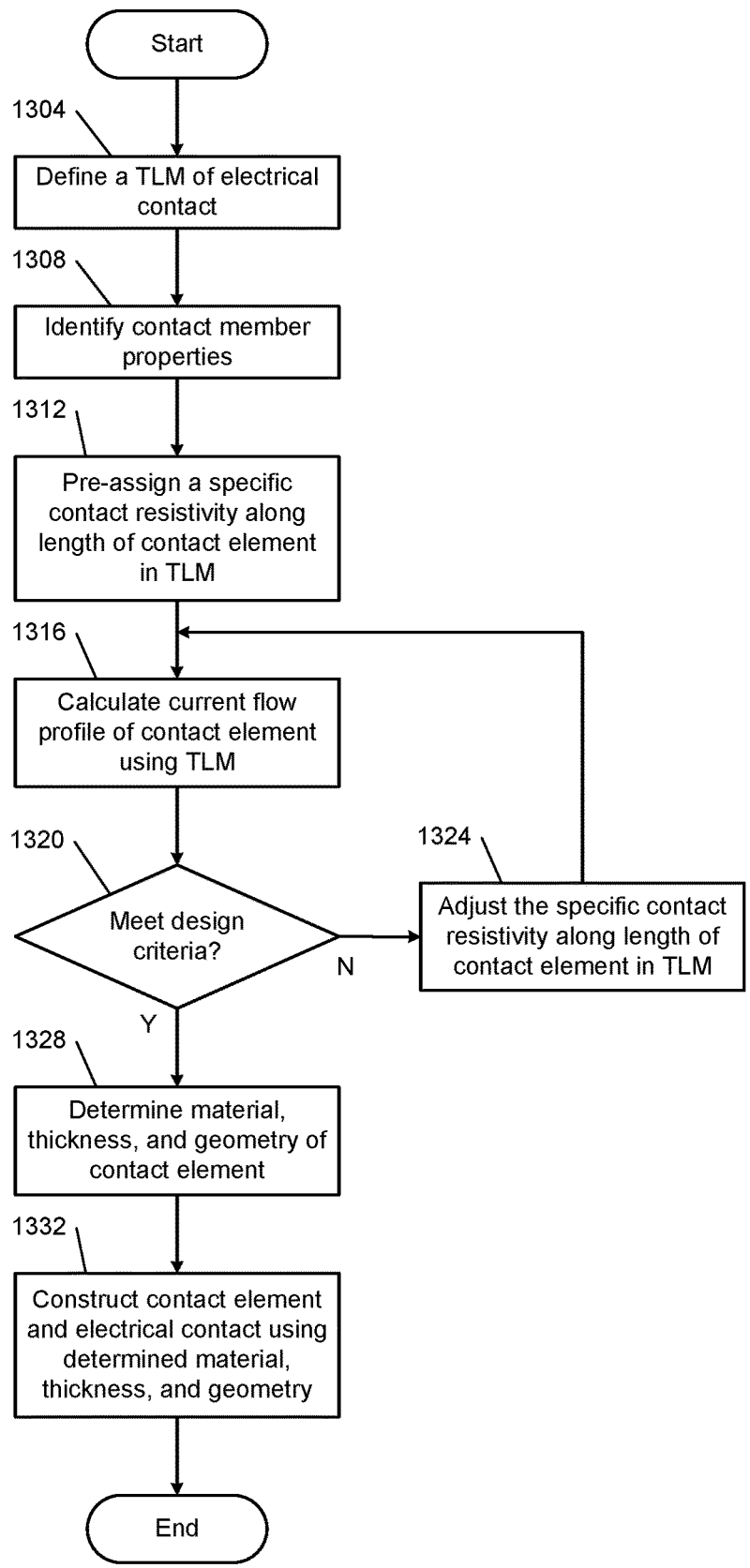
FIG. 13 is a flowchart of example construction of an electrical contact.

Referring now to FIG. 13, a flowchart depicts example construction of an electrical contact. The electrical contact includes a contact element positioned between a first contact member and a second contact member. As shown in FIG. 10, a voltage is applied across the electrical contact when the electrical contact is included in a circuit. The constructed electrical contact may be included in a nanoscale circuit, as described above. In various implementations, the electrical contact properties and dimensions may be calculated automatically by a calculation device and then the calculation device may instruct a manufacturing device of the electrical contact properties and dimensions. With the transmitted information, the manufacturing device may automatically construct the electrical contact as desired to prevent issues often found in electrical contacts, such as overheating.

Control begins at 1304 where a TLM of an electrical contact is defined. The TLM represents how the electrical contact will operate. At 1308, control identifies properties of the first contact member and the second contact member. The properties may include contact member data including a material the contact members are made of, a geometry of the contact members, and dimensions of the contact members. At 1312, control pre-assigns a specific contact resistivity along a length of the contact element in the TLM. The specific contact resistivity along the length of the contact element may vary. At 1316, control calculates a current flow profile based on a current distribution and voltage distribution (see Equations 1a-3, above) using the TLM. At 1320, control checks whether the resulted current flow and total contact resistance meet the design criteria. If design criteria is not met, control proceeds to 1324 and adjusts the specific contact resistivity along the length of contact element in TLM and returns to 1316 to calculate the current flow and total contact resistance using the adjusted specific contact resistivity. Otherwise, if, at 1320, the design criteria is met, control continues to 1328 to determine a material, a thickness, and a geometry of the contact element based on the contact resistance and the current flow profile of the TLM as well as the contact member data of the first contact member and the second contact member. At 1332, control constructs the contact element and electrical contact using the determined material, thickness, and geometry. As described previously, the constructing step may include transmitting the determined criteria to a manufacturing device configured to construct the electrical contact.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method of constructing an electrical contact including a contact element positioned between a first contact member and a second contact member, the method comprising:
    defining a transmission line model to represent operation of the electrical contact, wherein the transmission line model indicates a contact resistance and a specific contact resistivity along a length of the contact element;
    determining a current flow profile of the contact element, wherein the current flow profile is determined based on a current distribution using the transmission line model;
    determining at least one of: (i) a material, (ii) a thickness, and (iii) a geometry of the contact element based on the contact resistance and the current flow profile of the transmission line model; and
    constructing the contact element positioned between the first contact member and the second contact member with the at least one of (i) the material, (ii) the thickness, and (iii) the geometry.

2. The method of claim 1 further comprising:
    identifying a first material of the first contact member; and
    determining the at least one of (i) the material, (ii) the thickness, and (iii) the geometry of the contact element based on the first material of the first contact member.

3. The method of claim 1 further comprising:
    identifying a second material of the second contact member; and
    determining the at least one of (i) the material, (ii) the thickness, and (iii) the geometry of the contact element based on the second material of the second contact member.

4. The method of claim 1 further comprising:
    identifying a first geometry of the first contact member; and
    determining the at least one of (i) the material, (ii) the thickness, and (iii) the geometry of the contact element based on the first geometry of the first contact member.

5. The method of claim 1 further comprising:
    identifying a second geometry of the second contact member; and
    determining the at least one of (i) the material, (ii) the thickness, and (iii) the geometry of the contact element based on the second geometry of the second contact member.

6. The method of claim 1 further comprising:
    identifying a first set of dimensions of the first contact member; and
    determining the at least one of (i) the material, (ii) the thickness, and (iii) the geometry of the contact element based on the first set of dimensions of the first contact member.

7. The method of claim 1 further comprising:
    identifying a second set of dimensions of the second contact member; and
    determining the at least one of (i) the material, (ii) the thickness, and (iii) the geometry of the contact element based on the second set of dimensions of the second contact member.

8. The method of claim 1 wherein the current flow profile is determined based on a voltage distribution using the transmission line model.

9. The method of claim 1 wherein the specific contact resistivity along the length of the contact element varies.

10. The method of claim 9 wherein the electrical contact is defined as ohmic when the specific contact resistivity varies based on nonuniform doping and/or varying thickness of the contact element, and wherein the contact element is conducting.

11. The method of claim 1 wherein the electrical contact is defined as tunneling when the contact resistance varies based on a varying permittivity and/or varying thickness of the contact element, and wherein the contact element is insulating.

12. The method of claim 1 wherein the current flow profile is determined based on an input voltage applied to the electrical contact.

13. A method of constructing an electrical contact including a contact element positioned between a first contact member and a second contact member, the method comprising:
    defining a transmission line model to represent operation of the electrical contact, wherein the transmission line model indicates a contact resistance and a specific contact resistivity along a length of the contact element, wherein the specific contact resistivity along the length of the contact element varies;
    determining a current flow profile of the contact element, wherein the current flow profile is determined based on a current distribution and a voltage distribution using the transmission line model;
    determining (i) a material, (ii) a thickness, and (iii) a geometry of the contact element based on the contact resistance and the current flow profile of the transmission line model; and
    constructing the contact element positioned between the first contact member and the second contact member with (i) the material, (ii) the thickness, and (iii) the geometry.

14. The method of claim 13 further comprising, for the first contact member and the second contact member:
    identifying a material comprising the first contact member and the second contact member; and
    determining (i) the material, (ii) the thickness, and (iii) the geometry of the contact element based on the material.

15. The method of claim 13 further comprising:
    identifying a geometry and dimensions of the first contact member and the second contact member; and
    determining (i) the material, (ii) the thickness, and (iii) the geometry of the contact element based on the geometry and dimensions of the first contact member and the second contact member.

16. The method of claim 13 wherein the electrical contact is defined as tunneling when the contact resistance varies based on a varying permittivity and/or thickness of the contact element, and wherein the contact element is insulating.

17. The method of claim 13 wherein the current flow profile is determined based on an input voltage applied to the electrical contact.

18. A method of constructing an electrical contact including a contact element positioned between a first contact member and a second contact member, the method comprising:
- defining a transmission line model to represent operation of the electrical contact, wherein the transmission line model indicates a specific contact resistivity along a length of the contact element, wherein the specific contact resistivity along the length of the contact element varies;
- determining a current flow profile of the contact element, wherein the current flow profile is determined based on a current distribution and a voltage distribution using the transmission line model;
- for the first contact member and the second contact member, identifying contact member data including (i) a material, (ii) a geometry, and (iii) a set of dimensions;
- determining (i) a material, (ii) a thickness, and (iii) a geometry of the contact element based on:
  - the specific contact resistivity and the current flow profile of the transmission line model; and
  - the contact member data of the first contact member and the second contact member; and
- constructing the contact element positioned between the first contact member and the second contact member with (i) the material, (ii) the thickness, and (iii) the geometry.

19. The method of claim 18 wherein the electrical contact is defined as tunneling when the specific contact resistivity varies based on a varying permittivity and/or thickness of the contact element, wherein the contact element is insulating.

20. The method of claim 18 wherein the current flow profile is determined based on an input voltage applied to the electrical contact.

* * * * *